US010560057B1

(12) United States Patent
Fabrikant et al.

(10) Patent No.: US 10,560,057 B1
(45) Date of Patent: Feb. 11, 2020

(54) MEASURING MEDIA ATTENTION OVER TIME BASED ON LONG TERM HETEROGENEOUS ARCHIVE DATA

(71) Applicant: Google LLC, Mountain View, CA (US)

(72) Inventors: Alexander Fabrikant, East Palo Alto, CA (US); Andrew Stephen Tomkins, Menlo Park, CA (US); James Alexander Cook, Berkeley, CA (US); Atish Das Sarma, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/157,042

(22) Filed: Oct. 10, 2018

Related U.S. Application Data

(62) Division of application No. 13/959,667, filed on Aug. 5, 2013, now abandoned.

(60) Provisional application No. 61/680,228, filed on Aug. 6, 2012.

(51) Int. Cl.
*G06F 17/30* (2006.01)
*H03F 1/02* (2006.01)

(52) U.S. Cl.
CPC ..... *H03F 1/0238* (2013.01); *H03F 2200/102* (2013.01); *H03F 2200/435* (2013.01)

(58) Field of Classification Search
CPC .. G06F 16/24; H03F 1/0238; H03F 2200/102; H03F 2200/435
See application file for complete search history.

(56) References Cited

U.S. PATENT DOCUMENTS

| 8,229,873 | B1 | 7/2012 | Dolan et al. |
| 8,321,463 | B2 | 11/2012 | Cierniak et al. |
| 8,725,592 | B2 * | 5/2014 | Batra ................. G06Q 30/0631 705/26.7 |
| 8,838,564 | B2 * | 9/2014 | Sahni ...................... H04L 67/22 707/706 |
| 8,914,399 | B1 * | 12/2014 | Paleja ................. G06F 16/9535 707/767 |
| 8,972,402 | B1 | 3/2015 | Gupte et al. |
| 2005/0060312 | A1 | 3/2005 | Curtiss et al. |

(Continued)

OTHER PUBLICATIONS

Yang et al., Patterns of Temporal Variation in Online Media, WSDM '11, Feb. 9, 2011, received via IDS (Year: 2011).*

(Continued)

*Primary Examiner* — Tyler J Torgrimson
(74) *Attorney, Agent, or Firm* — Lowenstein Sandler LLP (57) ABSTRACT

A method is disclosed for estimating a duration that an instance of subject matter-related content will remain relevant. An archive of data sources spanning a period of time is analyzed to identify past instances in time in which a subject matter was newsworthy, and the duration of each instance. On receiving an indication that a user is interested in a current instance of the subject matter, an estimated period of time that the current instance will be of interest to the user is may be determined based on the duration of the past instances. In some aspects, the archive may be a corpus of social media data compiled from a social network, with each data source including or representative of an interaction between users in the social network, and the current instance of the subject technology may include content provided to the user through a social stream.

18 Claims, 4 Drawing Sheets

(56) References Cited

U.S. PATENT DOCUMENTS

| | | | |
|---|---|---|---|
| 2007/0038624 A1 | 2/2007 | Choi et al. | |
| 2010/0121682 A1 | 5/2010 | Abboa-Offei | |
| 2010/0319031 A1* | 12/2010 | Lee | G06Q 50/01 |
| | | | 725/46 |
| 2012/0005209 A1 | 1/2012 | Rinearson et al. | |
| 2012/0254184 A1* | 10/2012 | Choudhary | G06Q 30/0201 |
| | | | 707/738 |
| 2013/0041898 A1 | 2/2013 | Ishida | |
| 2013/0066864 A1 | 3/2013 | Rose et al. | |
| 2013/0173368 A1* | 7/2013 | Boutin | G06Q 10/101 |
| | | | 705/14.16 |
| 2014/0089309 A1 | 3/2014 | Ibasco et al. | |
| 2015/0112988 A1* | 4/2015 | Pereira | G06F 16/48 |
| | | | 707/736 |
| 2015/0317714 A1* | 11/2015 | Huet | G06F 16/951 |
| | | | 705/26.62 |

OTHER PUBLICATIONS

Liu et al., Personalized News Recommendation Based on Click Behavior, IUI '10, Feb. 7-10, 2010, (Year: 2010).*

Barrett, Brian. "Why Earthquake Tweets Reached You Before the Earthquake Did", Gizmodo.com, 2 pages. Retrieved Oct. 11, 2017 from URL: https://gizmodo.com/5833662/why-you-read-earthquake-tweets-before-you-felt-earthquake-shakes.

Hand, Eric. "Word Play" Nature, vol. 474, pp. 437-440, Jun. 23, 2011.

Liu, Jiahui, et al., "Personalized News Recommendation Based on Click Behavior" IUI '10, Feb. 7-10, 2010, Hong Kong, China. Retrieved on Nov. 24, 2017, from URL: https://dl.acm.org/citation.cfm?id=1719976.

Mack, Eric. "FCC Report: Net Has Heiped Suffocate Local News," CNet, Jun. 9, 2011, 6 pages. retrieved from URL: https://www.cnet.com/news/mark-zuckerberg-oculus-connect-virtual-reality-vr/.

Office Action dated Feb. 1, 2017 in U.S. Appl. No. 13/959,667.

Notice of Allowance dated Aug. 11, 2017 in U.S. Appl. No. 13/959,667.

Office Action dated Nov. 29, 2017 in U.S. Appl. No. 13/959,667.

Notice of Allowance dated Jul. 10, 2018 in U.S. Appl. No. 13/959,667.

Yang, Jaewon, et al. "Patterns of Temporal Variation in Online Media" WSDM '11, Feb. 9-12, 2011, Hong Kong, China.

* cited by examiner

MEASURING MEDIA ATTENTION OVER TIME BASED ON LONG TERM HETEROGENEOUS ARCHIVE DATA

CROSS-REFERENCE TO RELATED APPLICATIONS

The present application is a divisional application under 35 U.S.C. § 121 of U.S. patent application Ser. No. 13/959,667 entitled "Measuring Media Attention Over Time Based On Long Term Heterogeneous Archive Data," filed on Aug. 5, 2013, which claims the benefit of priority under 35 U.S.C. § 119 from U.S. Provisional Patent Application No. 61/680,228 entitled "Measuring Media Attention Over Time Based On Long Term Heterogeneous Archive Data," filed on Aug. 6, 2012, the disclosures of which are hereby incorporated by reference in their entirety for all purposes.

BACKGROUND

Popularity and trends of media topics may be determined in hindsight using various means. Data collected through digital media may be aggregated in a number of sophisticated ways to provide sociological insights about media attention in general, or detailed per-topic media timeline data to provide insights into history. There has also been a sharp growth in the availability of historical data sources, for example from social media, online news, books and newspapers in digitized form, and the like.

There are many things that can go wrong when trying to analyze a large media corpus in a uniform way. For example, archival data for past generations is decreasing due to everything from population growth, to economics of publishing, to destruction of literature by natural disaster, and the like. The optical character recognition (OCR) process is inherently error-prone, and OCR quality tends to degrade for older media, due to degrading microfilm quality and lower-quality printing press processes. Also, in corpuses where meta-data is also acquired via OCR, OCR errors in the scanned timestamp of the document can create wild variation in many aspects of the time series data. Variation in media trends over time has seen changes like growth in per-edition publication size, a shift from weekly to daily publications, and shortening of the timescale on which information is synchronized between publishers. Changes in language may also pose various problems when analyzing data unless it is the language itself that becomes a subject matter of interest.

SUMMARY

The subject technology provides a system and computer-implemented method for analyzing a large media corpus to estimate a duration that a current instance of a subject matter will remain relevant and providing subject matter-related content to a user. According to some aspects, a machine-readable media may include instructions thereon that, when executed, perform the computer-implemented method. In this regard, the method may include accessing a repository of archived data compiled from one or more data sources, the archived data spanning a period of time and including one or more instances of distinct subject matter during the period of time, determining a duration of time that each instance of the distinct subject matter was newsworthy based on a number of data sources for the distinct subject matter during a given instance stored in the repository, and determining an estimated duration that a current instance of the distinct subject matter will remain newsworthy based on one or more of the determined durations of time. Other aspects include corresponding systems, apparatus, and computer program products for implementation of the method.

The previously described aspects and other aspects may include one or more of the following features. For example, the method may comprise receiving an indication that a user is interested in the distinct subject matter, determining an estimated span of time that the subject matter will be of interest to the user based on the estimated duration that the current instance of the distinct subject matter will remain newsworthy, and providing, to the user, subject matter-related content for the estimated span of time. In this regard, the indication may be received during the current instance of the distinct subject matter. The subject matter-related content may include one or more advertisements. The method may also comprise determining an estimated monetary value of providing the subject matter-related content to the user for the estimated span of time based on an incremental value of a portion of the subject matter-related content, a demographic of the user, and the estimated duration of time. The method may further comprise providing a report, including an identification of the user and the estimated monetary value of providing the subject matter-related content for the estimated span of time.

The one or more data sources may comprise one or more online social interactions between users in a social network. The one or more data sources may include a plurality of electronically-scanned periodic printed publications, a plurality of user-generated web-based entries, and/or a representation of a celebrity persona. The estimated duration may be stored on a memory. Determining a duration of time that an instance of the distinct subject matter was newsworthy may comprise sampling a predetermined number of data sources over a plurality of discrete time intervals, identifying an interval of time that a rate of occurrence associated with the distinct subject matter satisfies a first threshold, and selecting, as the duration of time, a period that extends backward and forward in time from the identified interval of time wherein the rate of occurrence does not drop below a second threshold.

Additionally or in the alternative, determining a duration of time that an instance of the distinct subject matter was newsworthy may comprise sampling a predetermined number of data sources over a plurality of discrete time intervals, and selecting, as the duration of time, a longest span of time, within the plurality of discrete time intervals, in which all corresponding time intervals include a representation of the distinct subject matter. Additionally or in the alternative, determining a duration of time may comprise sampling a predetermined number of data sources over a plurality of discrete time intervals, determining a first time interval in which the distinct subject matter was present more than a first predetermined number of times, and determining a second time interval in which the distinct subject matter was present less than a second predetermined number of times. Additionally or in the alternative, determining a duration of time that each instance of the distinct subject matter was newsworthy may comprise discarding, from a sampled population of data sources, one or more representations of the distinct subject matter that occur less than a predetermined number of times in the sampled population of data sources, and sampling the population of data sources to identify one or more instances of the distinct subject matter.

An instance of subject matter may be newsworthy if the subject matter is present in more than a predetermined number of data sources during a corresponding time period.

Additionally or in the alternative, an instance of subject matter may be newsworthy if a frequency at which the subject matter is present in a sampled number of data sources satisfies a predetermined threshold for an interval of time corresponding to the sampled number of data sources.

In other aspects, a computer-implemented method may comprise receiving an indication that a user is interested in a subject matter, searching a repository of archived data for instances of the subject matter, determining a duration of time that each instance of the subject matter was newsworthy, determining an estimated duration that the subject matter will be of interest to the user based on a past duration of time in which the subject matter identified within the repository was newsworthy, and providing, to the user, subject matter-related content based on the estimated duration of time. Other aspects include corresponding systems, apparatus, and computer program products for implementation of the computer implemented method.

The previously described aspects and other aspects may include one or more of the following features. For example, the subject matter-related content may include one or more advertisements. The subject matter-related content includes a social posting provided to a social stream associated with a user of a social network, the indication based on the user interacting with the social posting. A status of the social posting within the social stream may be reduced after the estimated duration of time has elapsed. The social posting may be removed from the social stream after the estimated duration of time has elapsed. Additionally or in the alternative, searching the repository of archived data for instances of the subject matter may include identifying social network interactions associated with users of the social network in a predetermined demographic.

The method may further comprise determining an estimated monetary value of providing the subject matter-related content to the user for the estimated duration of time based on an incremental value of a portion of the subject matter-related content, a demographic of the user, and the estimated duration of time. Additionally or in the alternative, the method may comprise providing a report, including an identification of the user and the estimated monetary value of providing the subject matter-related content for the estimated duration of time. The method may further comprise sampling a predetermined number of data sources over a plurality of discrete time intervals, wherein an instance of subject matter is newsworthy if a frequency at which the subject matter is present in the sampled number of data sources satisfies a predetermined threshold for an interval of time corresponding to the sampled number of data sources.

In other aspects, a computer-implemented method may comprise identifying, from a corpus of social media, one or more past instances in time that a subject matter was newsworthy to a group of first users associated with a social network, coalescing data points for the subject matter in each past instance to determine a duration of each past instance, and estimating, based on the determined durations of each past instance, a period of time that a current instance of the subject matter will remain newsworthy to a second user of the social network. Other aspects include corresponding systems, apparatus, and computer program products for implementation of the method.

The previously described aspects and other aspects may include one or more of the following features. For example, the method may further comprise providing subject matter-related content for display in a social stream associated with the second user, the subject matter-related content being posted to the social stream by one or more of the group of first users, receiving an indication that the second user is interested in the subject matter-related content, and reducing a status of the subject matter-related content within the social stream after the estimated period of time has elapsed. The method may further comprise receiving an indication that the second user is interested in the subject matter based on one or more social network interactions of the second user within the social network, and providing a number of offerings related to the subject matter to the second user over the estimated period of time.

The group of first users may be in a demographic associated with the second user. Each data point may represent a sharing of subject matter-related content by a user in the group of first users. Each of the group of first users may be socially connected to the second user through a social graph of the second user, and wherein the period of time that the current instance of the subject matter will remain newsworthy to the second user may be based on the relationship of the group of first users to the second user. Other aspects include corresponding systems, apparatus, and computer program products for implementation of the method.

The previously described aspects and other aspects may provide one or more advantages, including, but not limited to, estimating a length of time that a user would be interested in a selected piece of content, and providing a mechanism for the content to the user during that period in which the user would be most interested in the content.

It is understood that other configurations of the subject technology will become readily apparent from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The subject technology consists of a combination of techniques for determining media attention spans over a period of time (e.g., several months, years, or more) of news archive data, which mixes various modern digital publications and social media, and may include scanned & archival material processed using optical character recognition (OCR). In this respect, the archived data sources (e.g., social media, web sites, blogs, scanned printed publications, and the like) spanning a period of time is analyzed to identify instances wherein a currently selected distinct subject matter was newsworthy (e.g., interesting or worthy of attention). An estimated duration that a current instance of the distinct subject matter will remain newsworthy may then be determined based on the duration of one or more of the identified prior instances of the subject matter.

Subject matter may include a news event, be representations of a specific person, or the like. Accordingly, archival materials may include physical and digital media and publications spanning several decades or even one or more centuries. As will be described in further detail, a system implementing the subject technology stores and analyzes archived data sources to determine instances of the subject matter and a duration of time that each instance was newsworthy in the past. The system may then estimate a duration that a current instance of the subject matter will remain newsworthy based on the determined past instances and corresponding durations. When the system receives an indication that a user is interested in the current instance of subject matter, the system determines an estimated span of time that the subject matter will be of interest to the user based on the estimated duration. The system may then provide content (e.g., one or more offerings) related to the subject matter to the user for the estimated span of time.

The period of time that a subject matter may remain newsworthy is particularly relevant in the context of social media. A social network may drive a social news stream based on how long users may be estimated to be actively involved in content displayed in the stream (e.g., reading and/or posting messages). A user's social stream includes posts, messages, pictures, and other social activities related to various subject matter posted by others in the user's social graph. The amount of content may become at times overwhelming to the user, and filtering the social stream to present only activities relevant to the user may be challenging in view of each user's unique and changing interests.

In this regard, data sources for determining whether a particular subject matter is newsworthy may include the users of the social network who consume content. Accordingly, the system of the subject technology may determine points in time that a particular subject matter was newsworthy to a group of entities (including, e.g., consuming users) in the past, and aggregates the entities' past interest in the subject matter and the time that each instance of the subject matter was of interest into a model of how long a current instance of subject matter may remain of interest to one or more of the entities.

While certain aspects of the subject technology may be applied to online social media content, the subject technology may be demonstrated using examples that pertain to subject matter pre-dating the digital realm of social media. For example, in the context of analyzing instances of subject matter over a long period of time (e.g., several years, decades, or a century or more), a subject matter "topic" may be restricted to personal names. People very rarely change their names, and English-language media has not changed its formatting of names radically since the "(first name) (last name)" format overtook the "Mr./Mrs. (last name)" format, seemingly in the first half of the 20th century. For most specific topics of media coverage, a personal names or a conjunction or disjunction of multiple personal names, can be used as reasonable proxies for identifying that topic.

In some aspects, a name that occurs only once in the whole corpus of analyzed data may be disregarded from the analysis. These names may be more likely to correspond to OCR errors. Most misspellings of a name with a small number of OCR errors have been found not to produce another string recognized as a name (e.g., by personal name recognizer software). Accordingly, the vast majority of the resulting names in the data may be unaffected by OCR errors. Articles within the corpus may be down-sampled. In a first example, the amount of articles may be sampled down to obtain the same number of articles within each time interval (e.g., a month). This compensates for variation in coverage volume across time periods, on the premise that the expected number of articles covering a topic in a given time span is proportional to the total volume of articles during that time span.

In another example, a corpus of articles may be sampled down to obtain the same number of articles with one or more personal name mentions per month. This assumes (1) that the historical fraction of articles which mention some names has been roughly constant over time, and (2) that scan/OCR quality is typically similar throughout a single article. Under these assumptions, this may correct for scan/OCR quality by rejecting articles scanned so poorly that no names can be recognized. In a further example, a corpus of articles may be sampled down to the same number of name mentions within a given month, counting an entity only once for each article it appears in. This compensates for scan/OCR quality, and requires only the assumption that different names are comparably likely to escape OCR errors, when per-name OCR errors are averaged corpus-wide.

To compensate for both information transmission delays, and for variation between weekly and daily publications, a certain time interval (e.g., one week) may be selected as the minimum unit of "meaningful" time durations. In one aspect, an instance of the distinct subject matter may be defined by a "maximum-rate media attention peak." A histogram of the number of occurrences of a topic for each week is determined. Then, the "maximum-rate media attention peak" is defined by (1) starting with the week with the highest number of occurrences of the topic as the "center" of the peak, and (2) defining the "start" of the peak as the earliest week before the center such that the number of mentions on each week between start and center was at least 10% of the level at the center; the "end" of the peak is defined symmetrically.

In another aspect, an instance of the distinct subject matter may be defined by a "longest-stretch media attention peak." The list of all occurrences of a topic is generated, and the longest time interval which contains no one contiguous week with no mentions of the topic at all is determined. Both of the previously described methods for defining a distinct topic coverage period have been found to be robust to OCR date errors. In the rare instances when OCR date errors happen, they are unlikely to destroy an existing peak, and very unlikely to form a new peak elsewhere.

Figure 1:
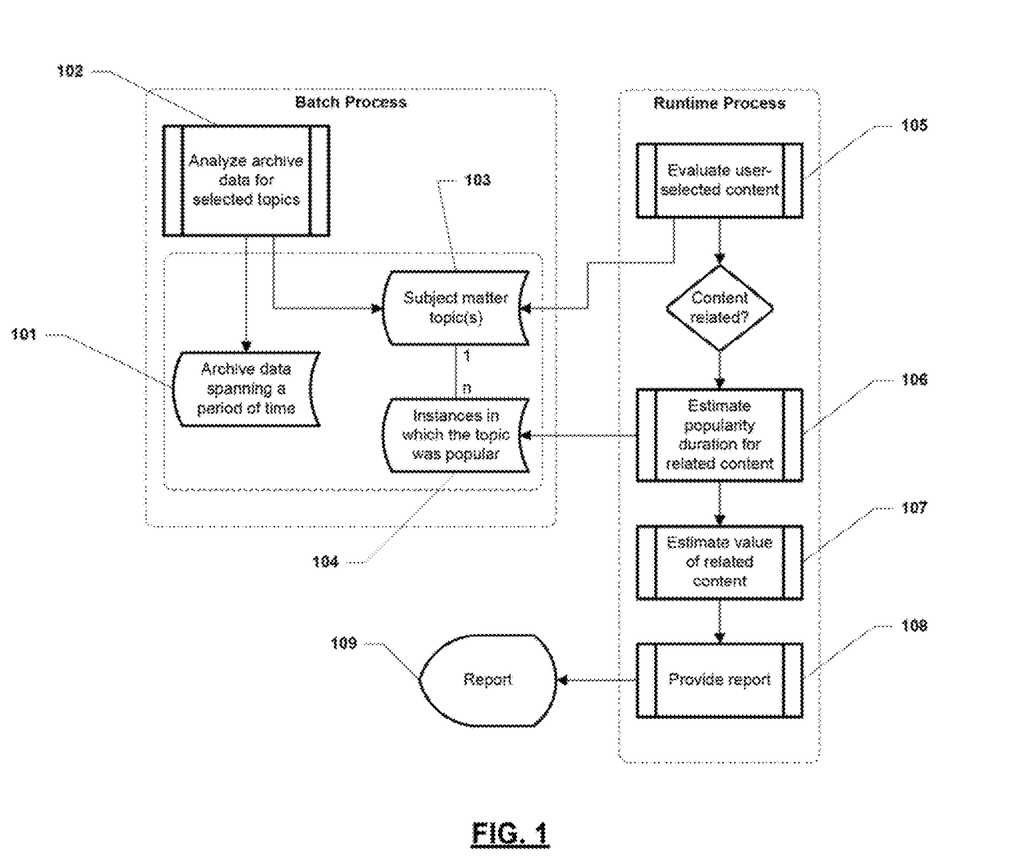
FIG. 1 is a state flow diagram depicting example processes for analyzing a corpus of archived data and providing a predictive valuation of user-selected content based on historical trends of related data within the archived data.

FIG. 1 is a state flow diagram depicting example processes for analyzing a corpus of archived data and providing a predictive valuation of user-selected content based on historical trends of related data within the archived data, according to some aspects of the subject technology. The blocks of FIG. 1 do not need to be performed in the order shown. It is understood that the depicted order is an illustration of one or more example approaches, and are not meant to be limited to the specific order or hierarchy presented. The blocks may be rearranged, and/or two or more of the blocks may be performed simultaneously.

Data compiled from one or more data sources, and spanning a period of time, may be archived into a data repository 101. As part of one or more batch processes, in block 102, subject matter (e.g., a known topic, individual, or celebrity) may be selected, and the archived data analyzed to measure the instances in time in which the subject matter was newsworthy, determine trends of increasing or decreasing popularity, determine a distribution in change in popularity over time, and the like. Media that describes or is related to the subject matter may be identified and coalesced for a certain instance in time, or portion of that instance, to determine the popularity of the subject matter during the time at which it is measured. An instance may be determined, for example, using a combination of techniques, including restricting the topic to personal names, discarding names that occur only once, down-sampling determined occurrences of the subject matter over discrete time periods (e.g., months, weeks, other date ranges) to compensate coverage over time, and the like.

Accordingly, the existence of a subject matter in media itself may determine a duration of time that each instance of the distinct subject matter was newsworthy based on a predetermined threshold related to a given instance. For example, an instance may be considered newsworthy based on a number of data sources in which the subject matter is present, when the subject matter satisfies a level of publicity (e.g., an amount of media attention that deviates from an expected level), or the like. An identified instance may further include, for example, a maximum media attention peak, and longest-stretch attention peak. In the context of social media, a data source may include or be representative of an online social interaction between a consumer of the subject matter and a provider of the subject matter. An interaction may include, for example the consumer viewing or commenting on a message or photo posted by the provider. Likewise, the level of publicity may include a threshold number of users who consume media that includes the subject matter.

Subject matter may be stored in a second data repository 103, and, for each distinct subject matter topic, an instance, including its corresponding period of time may be stored in a third data repository 104. In some aspects, the functionality of first data repository 101, second data repository 103, and third data repository 104 may be implemented on the same physical server or distributed among a group of servers, and/or implemented in the same storage or distributed across a group of storages. For example, each of the data repositories 101, 103, and 104 may be a file, data structure, or table in a single storage, or distributed across a group of storages. Moreover, the storages may take any form such as relational databases, object-oriented databases, file structures, text-based records, or other forms of data repositories.

If a current instance of the distinct subject matter becomes newsworthy, the subject technology may estimate how long the current instance will remain newsworthy, based on, for example, the previously determined durations of time, past levels of popularity, and the like. Similarly, subject matter-related content may identified, and an estimated duration of how long the content may remain newsworthy in one or more media streams, or how long the content may be of interest to a particular user, may be determined based on the same or similar data.

In one example, a runtime process may receive an indication that a user is interested in a certain content. As depicted by block 105, the user-selected content may be evaluated to determine if it is related to stored subject matter. If the content is related then, in block 106, the subject technology will determine an estimated span of time that the subject matter will be of interest to the user based on the estimated duration that the current instance of the distinct subject matter will remain newsworthy. In one aspect, the subject technology may provide, to the user, subject matter-related content for the estimated span of time. For example, the subject technology may be implemented in connection with a news feed to provide current subject matter-related news articles to the user. In another example, subject matter-related content may include one or more offerings (e.g., advertisements) that may be sent electronically to the user. The subject matter, or subject matter-related content may be used to influence the selection of offerings provided to the user.

In some aspects, an estimation of how long a current instance of the subject matter will remain newsworthy may also be used to quantify a hypothetical-interest value of subject matter-related content that may be provided to a user. For example, a user may be provided a group of content pieces (e.g., online search results, series of news articles provided by a website, or the like). If the user indicates an interest in one or more of those content pieces then it may be expected that content related to those pieces may also be provided to the user, and the related content may be monetized (e.g., through advertising).

In this regard, on receiving an indication that a user is interested in subject matter-related content (e.g., the user views or comments on a corresponding message or photo in a social stream), the subject technology may, in block 106, determine an estimated duration that the subject matter-related content will be of interest to the user based on one or more factors. Factors may include, for example, the subject matter, a popularity threshold of the subject matter, one or more of the previously determined prior instances, and the like.

In block 107, a current interest value of providing the subject matter-related content to the user may also be estimated for the estimated duration based on, for example, an incremental value of the content, a demographic of the user, and the estimated duration. In block 108, a report may then be provided that includes an identification of the user and the subject matter-related content, and the interest value of the subject matter-related content for the determined duration. The report may be configured to be readable on a display 109. The report may be provided, for example, to a vendor of subject matter-related content (e.g., one or more offerings) provided to the user, or an administrator or affiliate of the organization responsible for implementing the subject technology. The report may be sent electronically as an electronic document or email, or published to a secure web page or the like.

The previously described one or more processes may be implemented by a system that includes one or more computing devices (including, e.g., a desktop or server computer, tablet or notebook computer, personal data assistant, smart phone, a television or other display device with one or more computing devices embedded therein or attached thereto, or the like). In this regard, the processes may be implemented on the same physical computing device (e.g., a server) or distributed among a group of computing devices. The computing devices may be connected to and/or communicate with each other via the Internet or a remote private LAN/WAN. In some aspects, the various connections between the previously described devices, and/or the Internet or private LAN/WAN, may be made over a wired or wireless connection.

Figure 2:
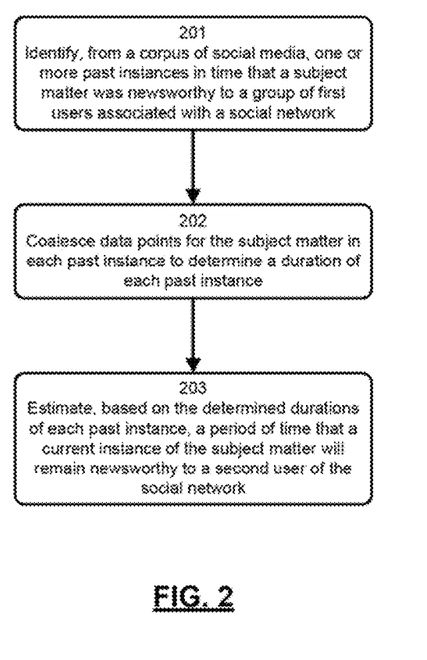
FIG. 2 is a flowchart depicting an example method for analyzing a social media corpus to estimate a duration that a current instance of a subject matter will be newsworthy to a user of a social network.

FIG. 2 is a flowchart depicting an example method for analyzing a social media corpus to estimate a duration that a current instance of a subject matter will be newsworthy to a user of a social network, according to some aspects of the subject technology. The blocks of FIG. 2 do not need to be performed in the order shown. It is understood that the depicted order is an illustration of one or more example approaches, and are not meant to be limited to the specific order or hierarchy presented. The blocks may be rearranged, and/or two or more of the blocks may be performed simultaneously.

According to one or more implementations, one or more blocks of FIG. 2 may be executed by one or more computing devices. Similarly, a non-transitory machine-readable storage medium may include machine-executable instructions thereon that, when executed by a computer or machine, perform the blocks of FIG. 2. Accordingly, the blocks of FIG. 2 may be performed within the context of social networks.

When content (including, e.g., one or more digital photos or photo albums, messages, videos, audio, or the like) is posted to a social stream the amount of time that the content may remain relevant to each consumer of the social stream may be determined so that the content may be removed from the social stream after the determined time, or its status within the social stream reduced. In one example, a user posts a series of vacation photos (e.g., in a digital photo album) over the course of several days to a social stream. If, after a period of time, the system determines that among that the first user's connections who have already observed these photos, the average user stops paying attention after seeing the third day's photos, scrolling quickly past any subsequent photos from the first user in this series, then the system may demote or remove the first user's vacation photos from the stream of any second user who follows posts by the first user after the second user observes these photos for three days.

Each of the user's connections (e.g., friends) is not expected to log into and view the album at the same time. In another example, the system of the subject technology may determine that a first set (e.g., fifty) of the user's connection have exhibited a certain amount of behavior with respect to the vacation photos during a first period of time and, based on that behavior, estimate how much attention the album will receive from a second set of the user's connections and for what duration. If, after a period of time, the system determines that only twenty of the user's connections observe the album in the social stream but only a few of them click on a couple of the pictures then the system may demote or remove the album from the social streams of the user's connections who log in over the following days.

In block 201, one or more past instances in time that a subject matter was newsworthy to a group of first users associated with a social network are identified. In various aspects, the one or more past instances are identified from a corpus of social media data. The group of first users may be socially connected to the second user through, for example, a social graph of the second user. For example, each of the first users may be designated as "friends" of the second user, or may have elected to follow the activities of the second user.

In some aspects, the system may aggregate users outside of the second user's social graph. The subject matter may also not be a particular user's post to a social stream but, rather, a generalized subject matter that may be associated with posts generated by any user. Accordingly, the system may aggregate the interest in a particular subject matter from all users in a shared demographic, an algorithmically-determined latent cluster of users, or all users in a social network or multiple social networks. The second user's social graph may also be filtered by a selected demographic to determine the group of first users. Additionally or in the alternative, the system may aggregate interest in a subject matter based on how many users of a social network or networks share (e.g., re-tweet) a message or photo representative of the subject matter.

In block 202, data points for the subject matter in each past instance are coalesced to determine a duration of each past instance. In various implementations, each data point may be an interaction between users in the social network that is associated with the subject matter, or between a user and content that includes the subject matter (subject matter-related content). In some implementations, each data point may represent a sharing of subject matter-related content by a user in the group of first users. For example, a data point may be a broadcast of content that was previously posted to a social stream to other users who may not have viewed the previous posting in the social stream.

An instance in time may be determined from a cluster of data points (for example, two or more points) around a specific point in time. The point in time may be determined, for example, from a midpoint in time at the center of the cluster, between a first data point at a first point in time at or near the beginning of the cluster and a second data point at a second point in time at or near the end of the cluster. The point in time may also be determined by the highest concentration of data points within the cluster (e.g., a subcluster). Software instructions may generate an instance in time to represent cluster of data points. In some aspects, an instance may be determined from, for example, one or more selected data points at the beginning of the cluster to one or more selected data points at the end of the cluster. In some aspects, the instance may be determined by moving outward in time from the determined point in time representative of the cluster. Accordingly, the cluster of data points provides an indication that the subject matter was newsworthy during the time spanning the relevant data points in the cluster.

In block 203, a period of time that a current instance of the subject matter will remain newsworthy to a second user of the social network is estimated based on the determined durations of each past instance. For example, if the group of users in the social network regularly find posts related to the subject matter interesting for a certain period of time then, when new content is posted to a social stream, a user in the group of users or having similar interests to those in the group may be estimated to remain interested in the new content for the certain period of time, or a period of time based on the certain period of time.

In some implementations, the period of time that the current instance of the subject matter will remain newsworthy to the second user is based on the relationship of the group of first users to the second user. For example, the estimated period of time may be longer if there is a history of interactions between the second user and a threshold number of the group of first users (e.g., above a predetermined number of interactions per day or week), or decreased if the user rarely interacts with the users (e.g., below the predetermined number of interactions).

The system may consider other factors in determining the duration that the current instance of the subject matter will remain newsworthy. For example, the duration may be based on the strength of the relationship between the consumer and provider of the current instance of the subject matter. If the relationship between two individuals is strong (e.g., they are in a romantic interest) then the subject matter may be displayed for a longer period of time. If a first user views a second user's photo album for one subject matter (e.g., a vacation) for an extended period of time then subsequent photo albums posted by the second user, even if not related to the same subject matter, may be displayed to the first user for longer periods of time.

In block 204, subject matter-related content is provided for display in a social stream associated with the second user. In this example, the subject matter-related content is content that was posted to the social stream by one or more of the group of first users. In block 205, an indication that the second user is interested in the one or more social network posts is received. The indication may be in the form of the second user following a link displayed in the social stream to view the subject matter-related content, endorsing the subject matter-related content, commenting on or sharing the subject matter-related content, or other activity that involves the content and indicates that the user has some interest in the content.

In block 206, a status of the one or more social network posts within the social stream is reduced after the estimated period of time has elapsed. Accordingly, social network content may be displayed at a frequency and/or highlighted within a social stream according to a given status. If the status is reduced then the content may be displayed less frequently, or no longer highlighted (e.g., displayed according to the time it was posted instead of at the beginning or top of the stream).

Figure 3:
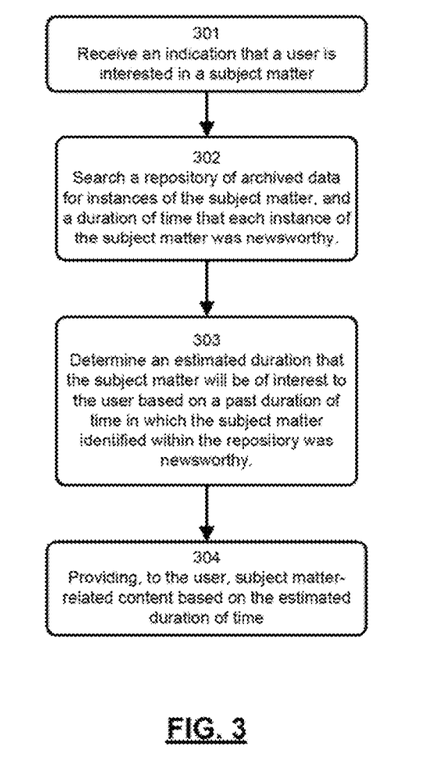
FIG. 3 is a flowchart depicting an example method for analyzing a media corpus to estimate a duration to provide subject matter-related content to a user.

FIG. 3 is a flowchart depicting an example method for analyzing a media corpus to estimate a duration to provide subject matter-related content to a user, according to some aspects of the subject technology. The blocks of FIG. 3 do not need to be performed in the order shown. It is understood that the depicted order is an illustration of one or more example approaches, and are not meant to be limited to the specific order or hierarchy presented. The blocks may be rearranged, and/or two or more of the blocks may be performed simultaneously. One or more blocks of FIG. 3 may be executed by one or more computing devices. Similarly, a non-transitory machine-readable storage medium may include machine-executable instructions thereon that, when executed by a computer or machine, perform the blocks of FIG. 3.

In block 301, an indication that a user is interested in a subject matter is received. In some aspects, the indication is received during the current instance of the distinct subject matter. In block 302, a repository of archived data is searched for instances of the subject matter, and a duration of time that each instance of the subject matter was newsworthy. The archived data may include numerous data sources, including, for example, a plurality of electronically-scanned periodic printed publications, a plurality of user-generated web-based entries (e.g., user web pages, social network profile pages and/or posts, blog entries, or the like).

In one or more examples, the subject matter may include a representation of a specific person (e.g., a celebrity persona or celebrity's name). In one aspect, an instance of the subject matter may be considered to be newsworthy if the subject matter is present in more than a predetermined number of data sources during a corresponding time period. In another aspect, an instance of subject matter may be considered to be newsworthy if a frequency at which the subject matter is present in a sampled number of data sources satisfies (e.g., is equal to, above, greater than, or the like) a predetermined threshold for an interval of time corresponding to the sampled number of data sources.

In block 303, an estimated duration that the subject matter will be of interest to the user is determined based on a past duration of time in which the subject matter identified within the repository was newsworthy. In block 304, subject matter-related content is provided to the user based on the estimated duration of time. For example, during future user interactions (e.g., with one or more websites), the subject technology may determine a likelihood that the subject matter, or a current instance of the subject matter, is newsworthy based on one or more past durations that the subject matter was newsworthy, and use that likelihood as a factor in determining whether to provide the subject matter-related content to the user. In some aspects, the subject matter-related content may be provided to the user for the estimated duration of time. Providing subject matter-related content may include providing news articles, links, emails, offerings, and/or advertisements related to the subject matter. In the context of social media, content related to the subject matter may be displayed in the user's social stream for the estimated duration of time, and then removed or demoted from a highlighted ranking within the stream.

Due to the automated OCR process, not every "item" pertaining to a subject matter in a corpus can be reasonably declared to contribute to the newsworthiness of the subject matter. For example, a single photo caption might be extracted as an independent article, or a sequence of articles on the same page of a news article might be misinterpreted as a single article. Rather than weighting each of these corpus items equally when measuring the attention paid to a name, the subject technology may elect to count multiple mentions of a name within an item separately, so that articles will tend to count more than captions.

Personal names generally have a relatively stable presence in media. Even with high OCR error rates in old microform, over $\frac{1}{7}$th of the articles since 1900 contain recognized personal names. But personal names are not without historical caveats. A woman appearing in 2005 stories as "Jane Smith" would be much more likely to be exclusively referenced as "Mrs. Smith", or even "Mrs. John Smith", in 1915. Also, names are less diverse in certain geographic areas. Accordingly, one focus may be on name appearance patterns that are most likely to represent a single news story or contiguous span of public attention involving that person, rather than trying to model the full media "lifetime" of individuals.

In some aspects, OCR errors in an article text may be ubiquitous. The edit distance between two recognizable personal names, however, may not be very short, so by discarding any name that occurs only once in the corpus, the subject technology may discard virtually all OCR errors as well, with no impact on data on substantially newsworthy people.

Also, many publications in a corpus dated up until the last 20 years or so may have been either published exclusively weekly or, in the case of Sunday newspaper issues, had substantially higher volume once a week. This may result in many otherwise obscure names having multiple news mentions separated by one week—a rather different phenomenon than a person remaining in the daily news for a full week. Accordingly, news patterns that are shorter than a few days may be disregarded.

To measure fame, the subject technology may begin by producing a list of names for each article. Short capitalized phrases may be extracted from the body text of each article, and phrases recognized by an algorithm to be personal names retained. For every name that appears in the input, that name's timeline may be considered. A timeline is the multiset of dates at which that name appears, including multiple occurrences within an article. The timeline may approximate the frequency with which a person browsing the news at random on a given day would encounter that name. The accuracy of this approximation may depend on the volume of news articles available. Accordingly, an approximately equal number of articles to work with from each month may be randomly selected. In general, the method can be applied to any collection of timelines.

Once a timeline has been computed for each name (or other subject matter) that appears in the corpus, a time may be selected during which that name may be considered to have had its period of fame, using one of the two methods described below. In order to compare the phenomenon of fame at different points in time, the joint distribution of two variables over the set of names may be considered: the peak date and the duration of the name's period of fame. The following two methods may compute a peak date and duration for each timeline.

Spike method. This method intends to capture the spike in public attention surrounding a particular news story. Data sources are sampled over a plurality of discrete time intervals (e.g., one-week intervals) and the name's rate of occurrence in each interval is determined. An interval of time is identified in which a rate of occurrence associated with the name satisfies a first threshold (e.g., at a maximum for the sampled time intervals), and, a period that extends backward and forward in time from the identified interval of time wherein the rate of occurrence does not drop below a second threshold is selected. In one example, the week with the highest rate is considered to be a peak date, and the period extends backward and forward in time as long as the rate does not drop below one tenth its maximum rate.

Continuity method. This method intends to measure the duration of public interest in a person. In one aspect, a predetermined number of data sources is sampled over a plurality of discrete time intervals, and the longest span of time in which all corresponding time intervals include a representation of the distinct subject matter is selected as the duration of public interest. For example, a name's period of popularity may be determined to be the longest span of time within which there is no seven-day period during which it is not mentioned. The peak date falls halfway between the beginning and the end of the period. Some durations may be short compared to the time span of the data analyzed, so, in some aspects, using any choice of peak date between the beginning and end may produce a similar distribution.

A set of names may be selected using various methods, including, for example, basic filtering, top x names by year, or the like. For example, the system may only analyze names that were in the top 1000 for some year. To reduce noise, a basic filtering technique may discard, from a sampled population of data sources (e.g., data sources over a predetermined time period, interval of time, or the like), one or more representations of the subject matter that occur less than a predetermined number of times in the sampled population of data sources. For example, the names which occurred less than ten times, or whose fame durations are less than two days may be discarded. (In both methods, a name whose fame begins Monday and ends Wednesday is considered to have a duration of two days.) The population of data sources may be sampled, and peaks that end in on a certain year (e.g., 2011) or later may be removed since these peaks might extend further if the news corpus extended further in the future.

In some examples, for each peak type, the set of names may be restricted. The total number of times each name appeared in each year (counting repeats within an article) may be counted, and, for each year, the set of the 1000 most frequently mentioned names in that year selected. The system may take the union of these sets over all years, and analyze a corpus of data using only the names in this set. A name's peak of popularity need not be the same year in which that name was in the top 1000. Thus, if a name is included in the top-1000 set because it was popular in a certain year, one implementation may consider that name's peak date to be a different year.

If a name's frequency of occurrence is proportional to its duration, then selecting the top 1000 names in each year may produce names with longer durations of fame in years with a greater number of names. With this in mind, the set of names may be further restricted. Accordingly, in each year y, the total number of distinct names $n_y$ mentioned in that year may be identified, and then the top $n_y/1000$ names in each year y selected. The corpus may then be analyzed using only the names in the union of those sets. As with the top-1000 filtering, a name's peak date will not necessarily be the same year for which it was in the top 0.1% of names.

The spike and continuity methods for identifying periods of fame may be affected by the volume of articles available in the corpus. For example, suppose a name's timeline is generated stochastically, with every article between February 1 and March 31 containing the name with a 1% probability. If the corpus contains 10000 articles in every week, then both the spike and continuity methods will probably decide that the article's duration is two months. However, if the corpus contains less than 100 articles in each week, then the durations will tend to be short, since there will be many weeks during which the name is not mentioned.

For example, each name v may have a "true" timeline which assigns to each day t a probability $f_v(t)\varepsilon[0, 1]$ that an article on that day will mention v. In this example, for each day, there is a total number of articles $n_t$; nothing is known of the relation between $n_t$ and v, except that there is some lower bound $n_t > n_{min}$ for all t within some reasonable range of time. Then suppose the timeline for name v is a sequence of independent random variables $X_{v,t} \sim \text{Binom}(f_v(t), n_t)$. A goal of the system is to take measurements that are independent of the values $n_t$.

To generate an independent news volume, news articles may be randomly sampled so that the expected number in each month is $n_{min}$. Let $X'_{v,t}$ be the number of sampled articles containing name v. If $n_{min}$ articles were randomly sampled without replacement, then $X'_{v,t} \sim \text{Binom}(f_v(t), n_{min})$. It is noted that the joint distribution of the random variables $X'_{v,t}$ is unaffected by the article volumes $n_t$. Any further measurement based on the variables $X'_{v,t}$ will therefore also be unrelated to the sequence $n_t$. In practice, instead of sampling exactly $n_{min}$ articles without replacement, a biased coin may be flipped (e.g., simulated by an algorithm) for each of the $n_t$ articles at time t, including each article with probability $n_{min}/n_t$. For a large enough volume of articles, the resulting measurements will be the same.

In one example, all articles published before 1895 were removed, since the months before 1895 had less than the target number $n_{min}$ of articles. Articles published after the end of the year 2010 were also removed to avoid having a month with news articles at the beginning but not the end of the month, but with the same number of sampled articles.

In some aspects, power law exponents may be estimated. In this respect, a test may be performed to determine that the tail of the distribution of fame durations follows a power law. For a given five-year period, all names which peak in that period are collected, and 20% of the names with the longest fame durations considered. $d_{min}$ is set to be the 80th percentile of durations, and consider durations $d > d_{min}$. Among those 20%, a maximum likelihood estimate of the power law exponent α is computed, predicting that the probability of a duration d>$d_{min}$ is p(d)∝$d^α$. The maximum likelihood estimate αt may be given by $$\hat{α}=1+(Σ_{i=1}^{n} \ln(d_i/d_{min})) \quad (1)$$

Since cumulative distributions rather than density functions are plotted, a line on each plot of cumulative distributions of fame durations, of slope α+1 on the log-log graph is included. The α̈ values measured are discussed if further detail below.

Statistical measurements may be taken. For example, bootstrapping may be used to estimate the uncertainty in four measured statistics: the 50th, 90th and 99th percentile durations and of the best-fit power law exponents. For selected periods (e.g., every five years), names may be sampled with one or more replacements from the set S of names that peaked in that period of time. For each statistic, this process may be repeated a predetermined number of times, and the range of numbers within which a predetermined percentage (e.g., 99%) of the samples fell reported.

Figure 4:
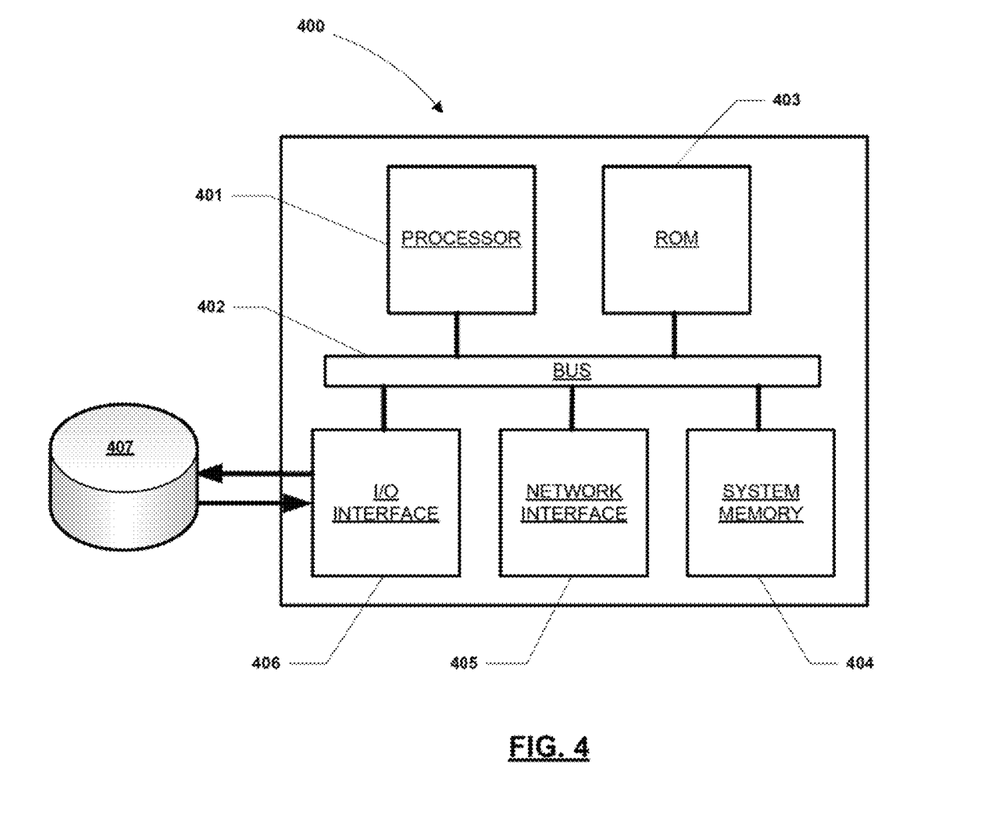
FIG. 4 is a diagram illustrating an example machine or computing device for analyzing a large media corpus to estimate a duration that a current instance of a subject matter will remain relevant to a user, including a processor and other internal components.

FIG. 4 is a diagram illustrating an example machine or computing device for analyzing a large media corpus to estimate a duration that a current instance of a subject matter will remain relevant to a user, including a processor and other internal components, according to some aspects of the subject technology. In some aspects, a computerized device 400 (e.g., a computing device configured to execute the processes of FIGS. 1-3) includes several internal components, for example, a processor 401, a system bus 402, read-only memory 403, system memory 404, network interface 405, I/O interface 406, and the like. In some aspects, processor 401 may also be in communication with a storage medium 407 (e.g., a hard drive, database, or data cloud) via I/O interface 406. In some aspects, all of these elements of device 400 may be integrated into a single device. In other aspects, these elements may be configured as separate components.

Processor 401 may be configured to execute code or instructions to perform the operations and functionality described herein, manage request flow and address mappings, and to perform calculations and generate commands. Processor 401 is configured to monitor and control the operation of the components in server 400. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on a ROM within processor 401. Likewise, one or more sequences of instructions may be software stored and read from system memory 405, ROM 403, or received from a storage medium 407 (e.g., via I/O interface 406). ROM 403, system memory 405, and storage medium 407 represent examples of machine or computer readable media on which instructions/code may be executable by processor 401. Machine or computer readable media may generally refer to any medium or media used to provide instructions to processor 401, including both volatile media, for example, dynamic memory used for system memory 404 or for buffers within processor 401, and non-volatile media, for example, electronic media, optical media, and magnetic media.

In some aspects, processor 401 is configured to communicate with one or more external devices (e.g., via I/O interface 406). Processor 401 is further configured to read data stored in system memory 404 or storage medium 407 and to transfer the read data to the one or more external devices in response to a request from the one or more external devices. The read data may include one or more web pages or other software presentation to be rendered on the one or more external devices. The one or more external devices may include a computing system, for example, a personal computer, a server, a workstation, a laptop computer, PDA, smart phone, and the like.

In some aspects, system memory 404 represents volatile memory used to temporarily store data and information used to manage device 400. According to some aspects of the subject technology, system memory 404 is random access memory (RAM), for example, double data rate (DDR) RAM. Other types of RAM also may be used to implement system memory 404. Memory 404 may be implemented using a single RAM module or multiple RAM modules. While system memory 404 is depicted as being part of device 400, it will be recognized that system memory 404 may be separate from device 400 without departing from the scope of the subject technology. Alternatively, system memory 404 may be a non-volatile memory, for example, a magnetic disk, flash memory, peripheral SSD, and the like.

I/O interface 406 may be configured to be coupled to one or more external devices, to receive data from the one or more external devices and to send data to the one or more external devices. I/O interface 406 may include both electrical and physical connections for operably coupling I/O interface 406 to processor 401, for example, via the bus 402. I/O interface 406 is configured to communicate data, addresses, and control signals between the internal components attached to bus 402 (e.g., processor 401) and one or more external devices (e.g., a hard drive). I/O interface 406 may be configured to implement a standard interface, for example, Serial-Attached SCSI (SAS), Fiber Channel interface, PCI Express (PCIe), SATA, USB, and the like. I/O interface 406 may be configured to implement only one interface. Alternatively, I/O interface 406 may be configured to implement multiple interfaces, which are individually selectable using a configuration parameter selected by a user or programmed at the time of assembly. I/O interface 406 may include one or more buffers for buffering transmissions between one or more external devices and bus 402 or the internal devices operably attached thereto.

Various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description provides various examples of the subject technology, and the subject technology is not limited to these examples. Various modifications to these aspects will be readily apparent, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the disclosure.

The term website, as used herein, may include any aspect of a website, including one or more web pages, one or more servers used to host or store web related content, and the like. Accordingly, the term website may be used interchangeably with the terms web page and server. The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A computer-implemented method, comprising:
   receiving an indication that a user is interested in a subject matter based on an interaction by the user with a social network;
   identifying instances of the subject matter in archived data stored at a repository;
   determining one or more durations of time that the instances of the subject matter satisfy a newsworthy criterion;
   determining an estimated duration of time that the subject matter will be of interest to the user based on one or more of the determined durations of time for which the instances of the subject matter satisfied the newsworthy criterion; and
   providing subject matter-related content for consumption by the user based on the estimated duration of time, wherein the subject matter-related content comprises a social posting provided to a social stream of the social network.

2. The computer-implemented method of claim 1, wherein a status of the social posting within the social stream is demoted after the estimated duration of time has elapsed.

3. The computer-implemented method of claim 1, wherein the social posting is removed from the social stream after the estimated duration of time has elapsed.

4. The computer-implemented method of claim 1, wherein identifying the instances of the subject matter in the archived data stored at the repository comprises:
   identifying social network interactions associated with users of the social network.

5. The computer-implemented method of claim 1, wherein the subject matter-related content includes one or more advertisements.

6. The computer-implemented method of claim 1, further comprising:
   determining an estimated monetary value of providing the subject matter-related content to the user for the estimated duration of time based on an incremental value of a portion of the subject matter-related content and the estimated duration of time.

7. A computer-implemented method comprising:
   receiving an indication that a user is interested in a subject matter;
   identifying instances of the subject matter in archived data stored at a repository;
   determining one or more durations of time that the instances of the subject matter satisfy a newsworthy criterion;
   determining an estimated duration of time that the subject matter will be of interest to the user based on one or more of the determined durations of time for which the instances of the subject matter satisfied the newsworthy criterion;
   providing subject matter-related content for consumption by the user based on the estimated duration of time; and
   determining an estimated monetary value of providing the subject matter-related content to the user for the estimated duration of time based on an incremental value of a portion of the subject matter-related content and the estimated duration of time.

8. The computer-implemented method of claim 7, wherein the subject matter-related content comprises a social posting provided to a social stream of a social network, the indication based on an interaction by the user with the social network.

9. The computer-implemented method of claim 8, wherein a status of the social posting within the social stream is demoted after the estimated duration of time has elapsed.

10. The computer-implemented method of claim 8, wherein the social posting is removed from the social stream after the estimated duration of time has elapsed.

11. The computer-implemented method of claim 8, wherein identifying the instances of the subject matter in the archived data stored at the repository comprises:
    identifying social network interactions associated with users of the social network.

12. The computer-implemented method of claim 7, wherein the subject matter-related content includes one or more advertisements.

13. A system comprising:
a memory; and
a processor, coupled to the memory, configured to:
receive an indication that a user is interested in a subject matter based on an interaction by the user with a social network;
identify instances of the subject matter in archived data stored at a repository;
determine one or more durations of time that the instances of the subject matter satisfy a newsworthy criterion;
determine an estimated duration of time that the subject matter will be of interest to the user based on one or more of the determined durations of time for which the instances of the subject matter satisfied the newsworthy criterion; and
provide subject matter-related content for consumption by the user based on the estimated duration of time, wherein the subject matter-related content comprises a social posting provided to a social stream of the social network.

14. The system of claim 13, wherein a status of the social posting within the social stream is demoted after the estimated duration of time has elapsed.

15. The system of claim 13, wherein the social posting is removed from the social stream after the estimated duration of time has elapsed.

16. The system of claim 13, wherein to identify the instances of the subject matter in the archived data stored at the repository, the processor to:
identify social network interactions associated with users of the social network.

17. The system of claim 13, wherein the subject matter-related content includes one or more advertisements.

18. The system of claim 13, the processor further to:
determine an estimated monetary value of providing the subject matter-related content to the user for the estimated duration of time based on an incremental value of a portion of the subject matter-related content and the estimated duration of time.

* * * * *